United States Patent
Luoh et al.

(10) Patent No.: US 8,003,519 B2
(45) Date of Patent: Aug. 23, 2011

(54) SYSTEMS AND METHODS FOR BACK END OF LINE PROCESSING OF SEMICONDUCTOR CIRCUITS

(75) Inventors: Tuung Luoh, Taipei (TW); Chi-Tung Huang, Hsinchu (TW); Kuang-Chao Chen, Hsinchu (TW); Candy Jiang, Hsinchu (TW)

(73) Assignee: Macronix International Co., Ltd. (TW)

( * ) Notice: Subject to any disclaimer, the term of this patent is extended or adjusted under 35 U.S.C. 154(b) by 43 days.

(21) Appl. No.: 11/847,135

(22) Filed: Aug. 29, 2007

(65) Prior Publication Data

US 2008/0119042 A1    May 22, 2008

Related U.S. Application Data

(63) Continuation-in-part of application No. 11/562,834, filed on Nov. 22, 2006, now abandoned.

(51) Int. Cl.
    *H01L 21/4763*      (2006.01)
(52) U.S. Cl. .. 438/629; 438/642; 438/648; 257/E21.577
(58) Field of Classification Search .......... 438/761, 438/584–688, 537; 257/E21.575, E21.597, 257/E21.495, E21.577
See application file for complete search history.

(56) References Cited

U.S. PATENT DOCUMENTS

| | | | | |
|---|---|---|---|---|
| 5,420,072 A * | 5/1995 | Fiordalice et al. | ............ | 438/607 |
| 5,552,341 A * | 9/1996 | Lee | ............... | 438/643 |
| 5,599,739 A * | 2/1997 | Merchant et al. | ............. | 438/628 |
| 6,037,258 A * | 3/2000 | Liu et al. | ........................ | 438/687 |
| 6,077,782 A * | 6/2000 | Hsu et al. | ...................... | 438/688 |
| 6,114,244 A * | 9/2000 | Hirose et al. | ..................... | 438/687 |
| 6,673,716 B1 * | 1/2004 | D'Couto et al. | ............. | 438/656 |
| 6,821,886 B1 * | 11/2004 | Layadi et al. | ................. | 438/653 |
| 2002/0017453 A1 * | 2/2002 | Iguchi | ..................... | 204/192.17 |
| 2005/0158990 A1 * | 7/2005 | Park et al. | .................... | 438/648 |
| 2005/0184348 A1 * | 8/2005 | Youn et al. | .................... | 257/401 |
| 2005/0186784 A1 * | 8/2005 | Park et al. | .................... | 438/642 |
| 2008/0119044 A1 * | 5/2008 | Luoh et al. | .................... | 438/644 |

OTHER PUBLICATIONS

Antonietta Oliva, Adel El-Sayed, Al Grifin and Clint Montgomery; Reflow of AlCu into Vias during CVD TiN Barrier Deposition; The Ninth International Symposium on Semiconductor Manufacturing pp. 419-422.

Mark M. Nelson, Jagdish Prasad, Brett N. Williams, Keith A. Ross, and Deborah Florence; Jan. 2003 IEEE 803-7981 pp. 99-102.

Sergei Drizlikh; Thomas Francis; Case of Via Resistance Increase During Thermal Cycle; May 2004 IEEE 0-7803-8312 pp. 162-165.

* cited by examiner

*Primary Examiner* — Matthew C Landau
*Assistant Examiner* — Colleen E Snow
(74) *Attorney, Agent, or Firm* — Baker & McKenzie LLP

(57) ABSTRACT

A BEOL manufacturing process for forming a via process between two metal lines on a semiconductor wafer comprises depositing a portion of a first metal adhesion layer within a patterned via hole, followed by a cooling step. The cooling step is then followed by formation of the remainder of the first metal adhesion layer and formation of a second metal adhesion layer within the patterned via hole. This process of forming the remaining portion of the first metal adhesion layer can be referred to as a wafer load, unload, load (LUL) process. By using a LUL process, thermal history is minimized, which reduces Al extrusion at the via interfaces.

33 Claims, 4 Drawing Sheets

SYSTEMS AND METHODS FOR BACK END OF LINE PROCESSING OF SEMICONDUCTOR CIRCUITS

RELATED APPLICATION

This application is a continuation-in-part application of U.S. patent application Ser. No. 11/562,834 filed on Nov. 22, 2006 including the specification, claims, drawings and summary. The disclosure of the above patent application is incorporated herein by reference in its entirety.

BACKGROUND

1. Field of the Invention

The invention relates generally to semiconductor fabrication, and more particularly to back end of line (BEOL) techniques that reduce manufacturing errors related to via metal melt extrusion 2. Background of the Invention Semiconductor wafers are manufactured in accordance with a process flow. The process flow comprises all of the different processing steps, such as etching and photolithography, involved in the process of manufacturing semiconductor wafers. A typical process flow can consist of 300-400 steps, wherein each of these steps contributes to the final circuit structures formed within a single chip on the semiconductor wafer. A typical process flow is divided into two main sub-processes. The first of these main sub-processes can be termed the front end of line (FEOL) process, and the second of these main sub-processes can be termed the back end of line (BEOL) process.

The FEOL process typically starts from the laser marking of wafer lots and continues through the formation of Shallow Trench Isolation (STI), implantation of P and N wells, etching of poly, and followed by implantation of various regions such as the drain and source regions of a transistor structure.

The BEOL process can comprise the formation of metal lines and via contacts between metal lines in different layers of the wafer. Often, there are two, or more metal layers comprising metal interconnection lines. Vias run between two metal layers. The BEOL process is a process whereby devices in the FEOL layers are interconnected with other circuits forming the chip and to the outside world.

Metal layers are typically formed via a Physical Vapor Deposition (PVD) process. A typical PVD process comprises the deposition of metal layers as followed. These metal layers typically comprise Ti, TiN, Al or AlCu, and Ti and TiN. First, for example, Ti layer and TiN layer are deposited followed by the deposition of an Al layer, and then the deposition of Ti layer and TiN layer.

Vias are then patterned in the lower metal layers and further metal layers are formed over the lower metal layers. Conventionally, a via is formed by first forming metal adhesion layers within the patterned via hole and then forming a tungsten (W) plug inside of the metal adhesion layers. The metal adhesion layers often comprise a Titanium (Ti) metal layer formed within the patterned via hole and a Titanium Nitride (TiN) layer formed with the Ti Layer. The Ti Layer is often formed in a first deposition chamber (CH 1) and the TiN layer is often formed in a second deposition chamber (CH 2). The Ti adhesion layer can be formed using PVD, or more specifically Ionized Metal Plasma (IMP) PVD. The TiN adhesion layer can be formed using Metal Organic Chemical Vapor Deposition (MOCVD)

It will be understood that the metal adhesion layer formation can subject the wafer to high heat. For example, in a conventional process, the temperature in CH 1 can be as high as 200° C. and rising throughout the process. The temperature in CH 2 can be as high as 450° C. Unfortunately, the Al in the metal layers can melt at temperatures around 600° C. The back-to-back heating processes can actually cause the wafer temperature to exceed the Al melting point, which cause the Al to extrude into the via. This can increase the via resistance and lead to device performance problems and even failures.

One solution to this problem is to reduce the heat cycle times associated with deposition of the Ti layers by thinning the Ti layers in adhesion layer; however, such solutions are not ideal since reducing the heat cycling time by reducing the thickness of the Ti layers will reduce reliability as well.

SUMMARY

A BEOL via adhesion manufacturing process comprises forming a first portion of a metal adhesion layer, such as a Ti layer, within a patterned via and then removing the wafer from the chamber and placing it in a cooling chamber to undergo a cooling process. The wafer can then be placed back into the chamber for formation of the remainder of the metal adhesion layer. The wafer can then be placed into another chamber for formation of a second metal adhesion layer, such as a TiN layer, within the patterned via. The process can be referred to as a wafer Load-Unload-Load (LUL) process. By using the LUL process the thermal processing of the wafer is minimized, which reduces Al extrusion at the via interfaces.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1:
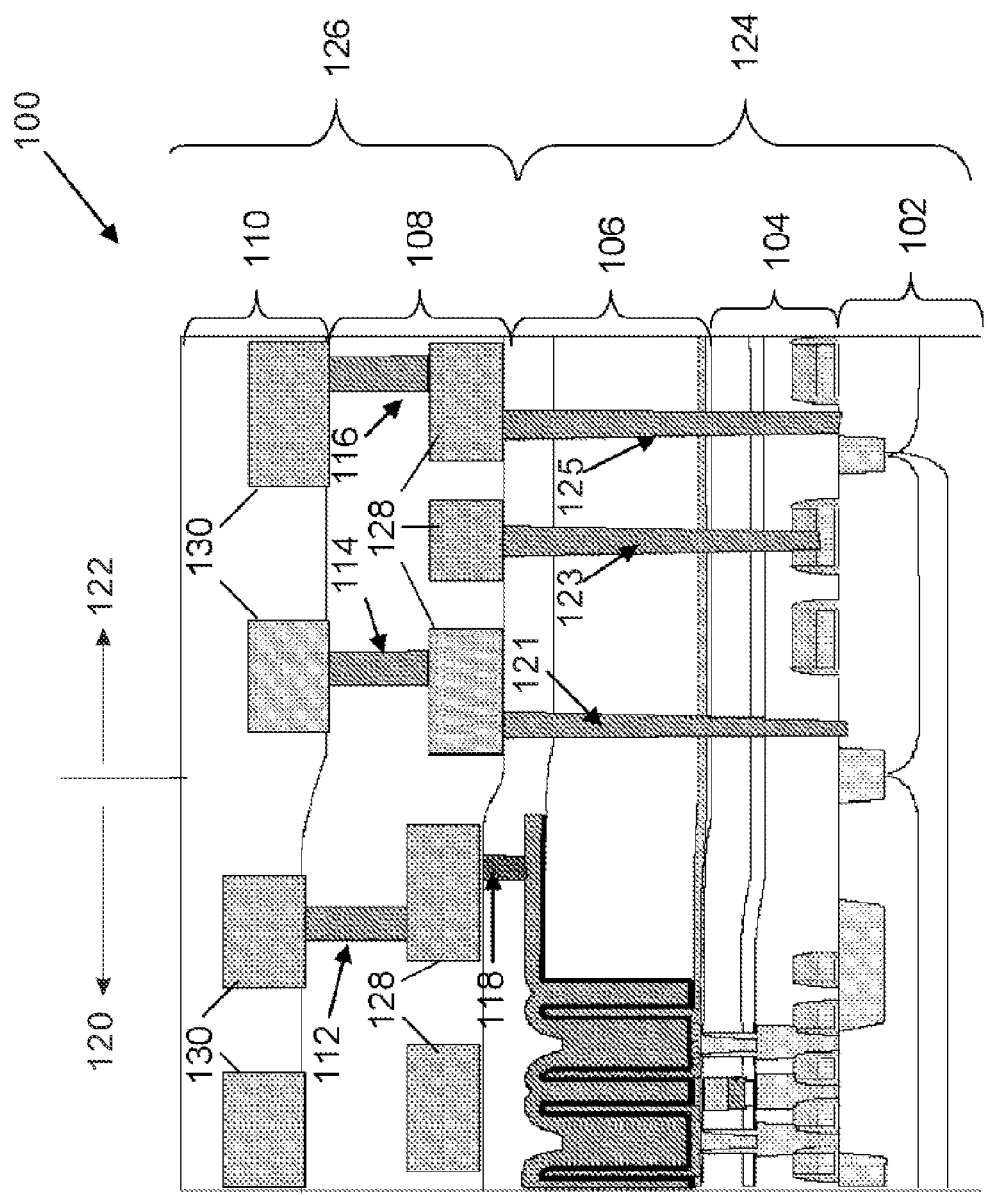
FIG. 1 is a diagram illustrating an exemplary semiconductor circuit that can comprise a single chip on a semiconductor wafer.

FIG. 1 is a diagram illustrating an example semiconductor circuit 100 that can comprise a single chip on a semiconductor wafer. In the example of FIG. 1, circuit 100 is a memory circuit comprising a main memory portion 120 and a periphery portion 122. Main memory portion 120 can comprise the structures that form memory circuit 100, while periphery portion 122 can comprise the interconnects and control circuitry required to interfaced the main memory portion 120 with the control circuits and interconnects required to control and access main memory portion 120.

It will be understood that while the systems and methods described below will be described in relation to a memory circuit such as circuit 100, the invention is in no way restricted to memory circuits. Rather, it will be clear that the systems and methods described herein can be applied to any BEOL process regardless of the type of circuit involved. Further, while there are two metal layers 108 and 110 illustrated in the example of FIG. 1, it will be understood that the systems and methods described below can be extended to circuits with fewer or more metal layers, and that two metal layers are shown by way of example only.

Circuit 100 comprises several layers constructed using various well-known semiconductor processing techniques. For example, circuit 100 can comprise device layer 124, which can be constructed using FEOL techniques, and an interconnect layer 126, which can be constructed using BEOL techniques.

Device layer 124, can comprise several sub-layers. These sub-layers can include a well 102, which can comprise a silicon well and various regions, i.e., drain and source regions, implanted therein. The semiconductor well and implanted regions can be formed using well-known semiconductor techniques. A word/bit line layer 104 can then be formed on top of well layer 102. Word/bit line layer 104 can comprise various interconnect lines such as word lines and bit lines formed using well-known semiconductor techniques. A storage layer 106 can then be formed on top of word/bit line layer 104.

Interconnect layer 126 can comprise several metal layers, of which metal layer 1 108 and metal layer 2 110 are illustrated by way of example. Metal layers 108 and 110 can comprise metal contacts such as metal contacts 128 and 130 as well as interconnecting vias, such as vias 112, 114 and 116, configured to connect metal contacts 130 and 128 as shown. In addition, vias such as vias 118, 121, 123, and 125, can also be included to connect metal contacts 128 to various layers within device layer 124 as illustrated.

Figure 2:
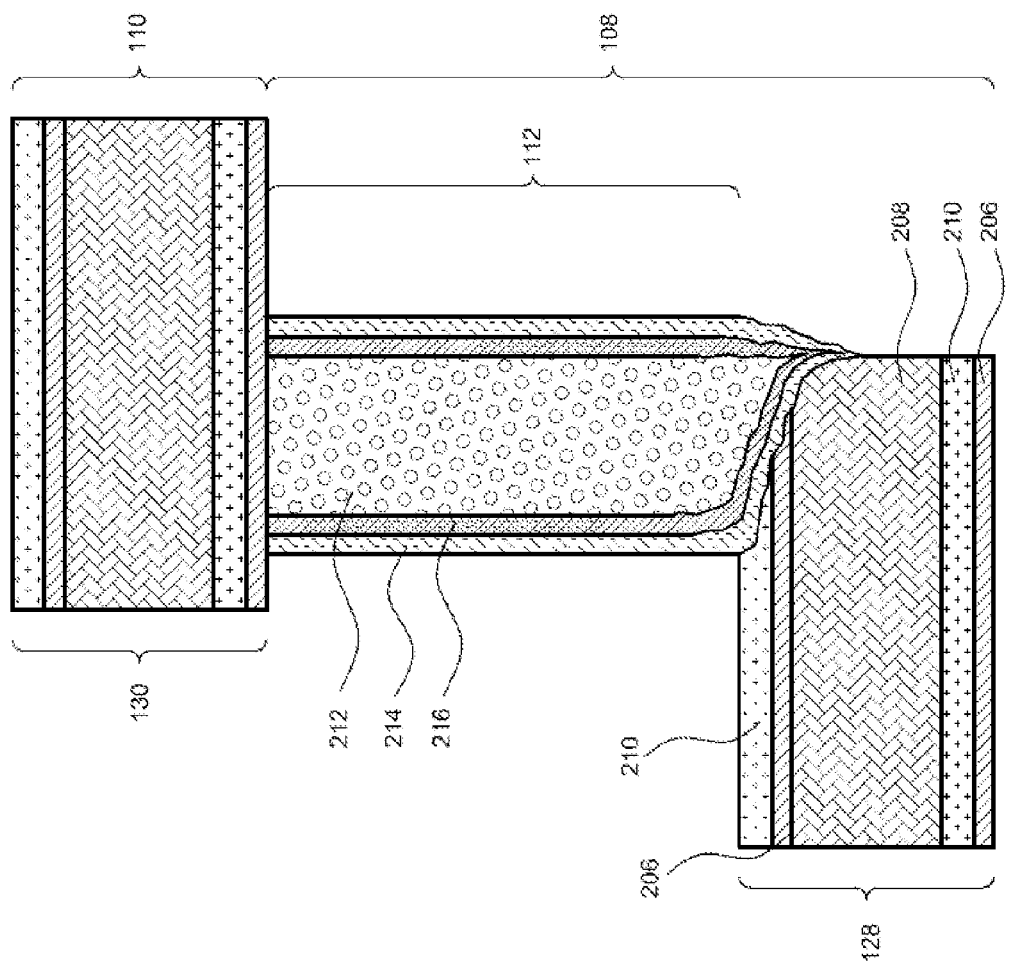
FIG. 2 is a diagram illustrating a portion of via within the circuit of FIG. 1 in more detail.

FIG. 2 is a diagram illustrating a portion of interconnect layer 126 in more detail. FIG. 2 illustrates a portion of interconnect layer 126 surrounding via 112 in metal layer 1 108. Thus, via 112 is bounded above and below by metal contacts 130 and 128, respectively. As can be seen, a metal contact, such as metal contact 128, can comprise a plurality of metal layers. These layers can include Ti layers 206, TiN layers 210, and Al layer 208.

It will be understood that while the example of FIG. 2 metal layer 128 includes Ti layers 206, TiN layers 210, and an Al layer 208, other layers can also be incorporated in addition, or in place of the layers illustrated in FIG. 2. For example, Al layer 208 can be replaced by an AlCu layer.

Figure 3:
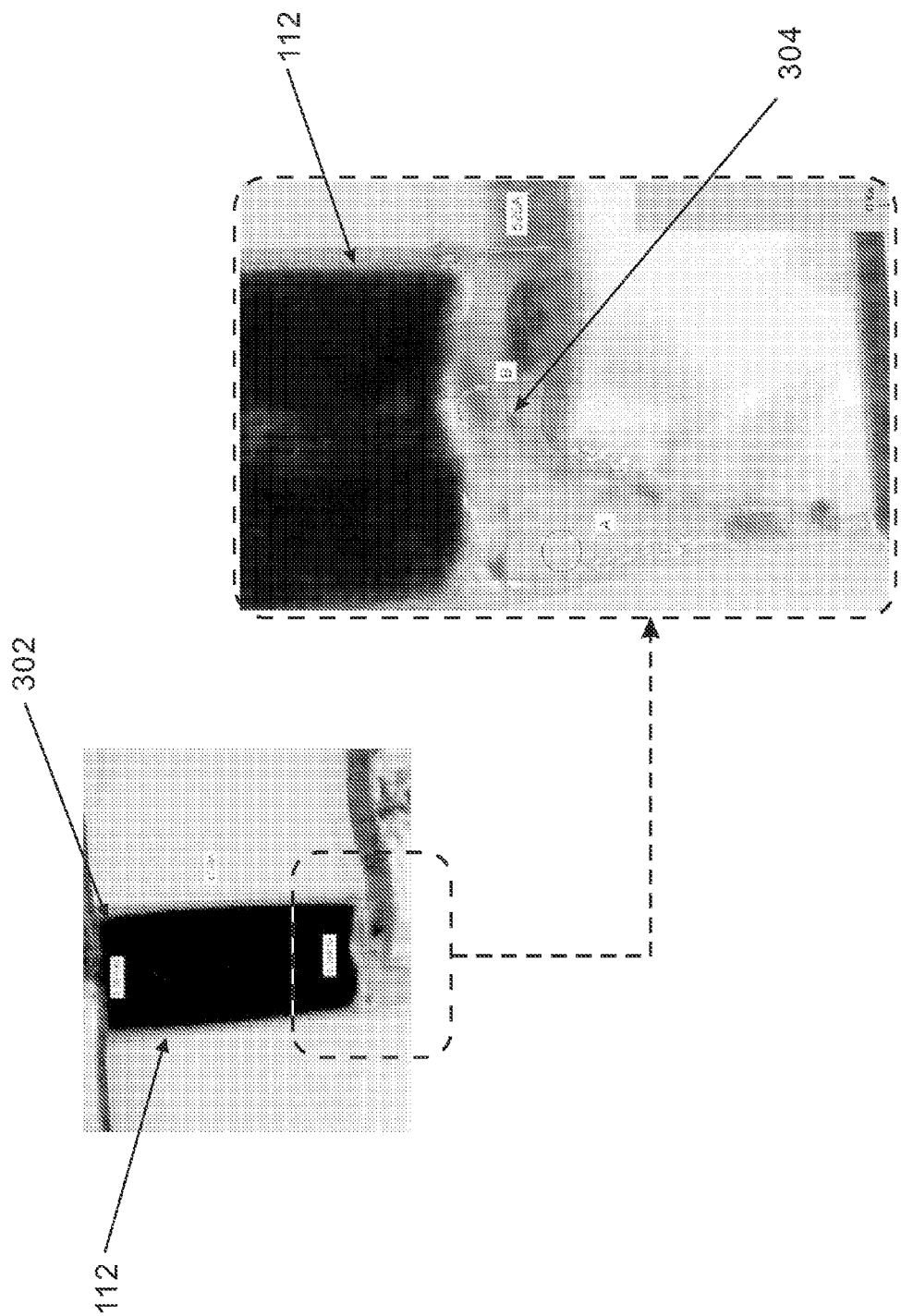
FIG. 3 is a Transmission Electron Microscope (TEM) image illustrating Al extrusion that can result from a conventional via formation process.

Via 112 can then comprise metal adhesion layers 214 and 216 and W plug 212. For example, as explained above, metal adhesion layer 214 can comprise a TiN layer grown using MOCVD, while metal layer 216 can comprise a Ti layer grown using IMP PVD. If a conventional process is used to form layers 214 and 216, however, then extrusion of Al layer 208 can result. This is illustrated in FIG. 3. FIG. 3 is a TEM that illustrates Al extrusion at the lower end 304 of via 112. In the TEM of FIG. 3, the top portion 302 of via 112 is unaffected; however, the extrusion of portion 304 can increase resistance and lower reliability of the connection made by via 112.

The extrusion phenomenon illustrated in FIG. 3 occurs, because the temperature cycle, i.e., the temperature and time, required to effect the deposition of metal adhesion layer 214 and 216 can actually cause Al layer 208 to melt.

Figure 4:
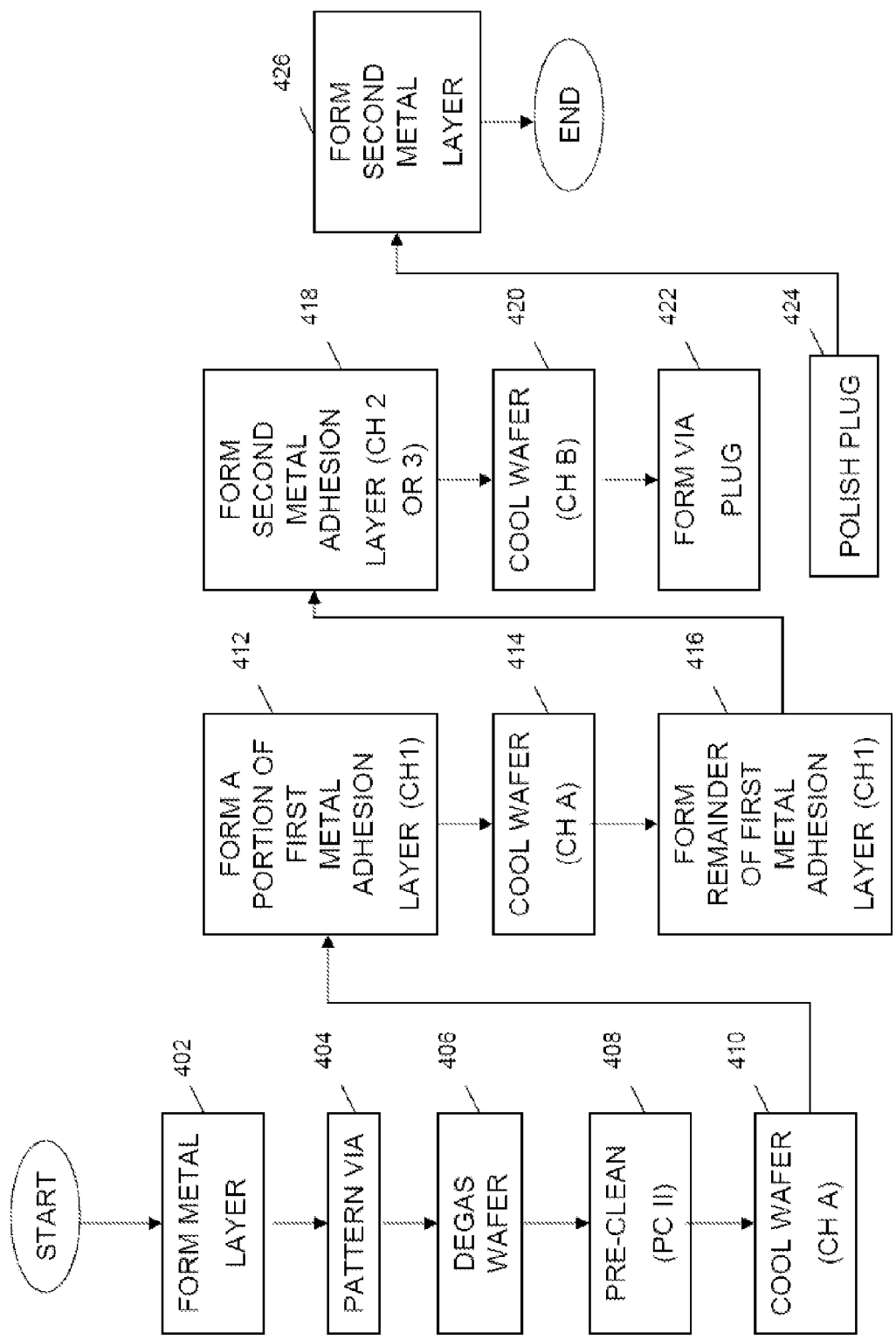
FIG. 4 is a flowchart illustrating an example method for depositing metal adhesion layers during via formation in accordance with one embodiment.

FIG. 4 is a diagram illustrating a process for forming a via, such as via 112, in accordance with one embodiment of the systems and methods described herein. First in step 402, a first metal layer (metal layer 1) can be formed. The metal layer can actual comprise a plurality of metal layers as illustrated for layer 128 in FIG. 2. Thus, step 402 can comprise the formation of a Ti layer, a TiN layer, an Al layer, a second Ti layer, and a second TiN layer. The metal layers can, for example, be formed via PVD, or more specifically IMP PVD.

In step 404 a via, such as via 112, can be patterned and in step 406 the wafer can be degassed. In step 408, the wafer can be placed into a pre-cleaning chamber (PC II) and in step 410 the wafer can be removed from the PC II and placed into a cooling chamber (CH A).

In step 412, the wafer can be removed from CH A and placed into a deposition chamber (CH 1) in which a metal adhesion layer, e.g., Ti layer 216, can be formed in the patterned via hole; however, only a portion of the metal layer is formed. The wafer is then removed from CH 1 and placed back into a cooling chamber or returned to the load lock, where the wafer is cooled again in step 414. Since Ti can adsorb oxygen, there is no native oxide issue when the wafer is exposed to the atmosphere. Then, in step 416, the wafer is placed back into CH 1 and the remainder of the adhesion layer is formed. This is the LUL process, which can reduce the overall thermal stressing of the wafer and prevent Al extrusion.

The Ti Layer can be formed using IMP PVD. For example, a Ti layer of 400 Å can be formed by first forming a 200 Å layer and then forming another 200 Å layer of Ti. Accordingly, the Ti layer thickness can be maintained at a thickness of 400 Å without over stressing the wafer. Each CH 1 step can be at a temperature of approximately between 100 and 300° C., preferably between 10 and 50 seconds at 200° C., and more preferably at 49 seconds. It will be understood, however, that the dimensions and temperatures provided are by way of example only and will depend on the requirements of specific implementation.

In step 418, the wafer can then be placed in another deposition chamber (CH 2 or CH 3) for formation of a second metal adhesion layer, e.g., a TiN layer 216. The second metal adhesion layer can, e.g., be formed using MOCVD. The CH 2 or CH 3 processing time can be at a temperature of approximately between 300 and 450° C., preferably between 50 and 200 seconds at 450° C., and more preferably at between 100 and 177 seconds.

In step 420, the wafer can be removed and placed in a second cooling chamber (CH B). A W plug can then be formed in the patterned via hole in step 422. The W plug can then be polished, e.g., using CMP, in step 424, and the second metal layer can be formed in step 426. Again, the second metal layer can actual comprise a plurality of metal layers as illustrated for layer 130 in FIG. 2. Thus, step 402 can comprise the formation of a Ti layer, a TiN layer, an Al layer, a second Ti layer, and a second TiN layer. The metal layers can, for example, be formed via PVD, or more specifically IMP PVD.

Thus, by implementing the process of FIG. 4, Al extrusion can be avoided, while still maintaining Ti adhesion layer thickness, which can improve device reliability and lower failure rates.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for forming via on a semiconductor wafer in a back end of the line (BEOL) process, comprising:
    patterning a via hole for formation of the via;

forming a portion of a first metal adhesion layer comprising Ti in the patterned via hole;
cooling the wafer after the forming of the portion of the first metal adhesion layer;
forming a remaining portion of the first metal adhesion layer in the patterned via hole after the cooling of the wafer; and
forming a second metal adhesion layer comprising TiN directly on the first metal adhesion layer within the patterned via hole.

2. The method of claim 1, further comprising cleaning the wafer before forming the portion of the first metal adhesion layer.

3. The method of claim 2, further comprising cooling the wafer after cleaning the wafer and before forming the portion of the first metal adhesion layer.

4. The method of claim 1, further comprising cooling the wafer after forming the second metal adhesion layer.

5. The method of claim 1, wherein forming the portion of the first metal adhesion layer comprises depositing the portion of the first metal adhesion layer within the patterned via hole.

6. The method of claim 5, wherein the portion of the first metal adhesion layer is deposited using physical vapor deposition.

7. The method of claim 1, wherein forming the remainder of the first metal adhesion layer comprises depositing the remainder of the first metal adhesion layer within the patterned via hole.

8. The method of claim 7, wherein the remainder of the first metal adhesion layer is deposited using physical vapor deposition.

9. The method of claim 1, wherein forming the second metal adhesion layer comprises depositing the second metal adhesion layer within the patterned via hole.

10. The method of claim 9, wherein the second metal adhesion layer is deposited using metal organic chemical vapor deposition.

11. The method of claim 1, further comprising forming a metal plug inside the first and second metal adhesion layers within the patterned via hole.

12. A method for forming via on a semiconductor wafer in a back end of the line (BEOL) process, comprising:
forming a first metal layer;
patterning a via hole for formation of the via;
forming a portion of a first metal adhesion layer comprising Ti in the patterned via hole;
cooling the wafer after the forming of the portion of the first metal adhesion layer;
forming a remaining portion of the first metal adhesion layer in the patterned via hole after the cooling of the wafer;
forming a second metal adhesion layer comprising TiN directly on the first metal adhesion layer within the patterned via hole; and
forming a metal plug inside the first and second metal adhesion layers within the patterned via hole.

13. The method of claim 12, further comprising cleaning the wafer before forming the portion of the first metal adhesion layer.

14. The method of claim 13, further comprising cooling the wafer after cleaning the wafer and before forming the portion of the first metal adhesion layer.

15. The method of claim 12, further comprising cooling the wafer after forming the second metal adhesion layer.

16. The method of claim 12, wherein forming the portion of the first metal adhesion layer comprises depositing the portion of the first metal adhesion layer within the patterned via hole.

17. The method of claim 16, wherein the portion of the first metal adhesion layer is deposited using physical vapor deposition.

18. The method of claim 12, wherein forming the remainder of the first metal adhesion layer comprises depositing the remainder of the first metal adhesion layer within the patterned via hole.

19. The method of claim 18, wherein the remainder of the first metal adhesion layer is deposited using physical vapor deposition.

20. The method of claim 12, wherein forming the second metal adhesion layer comprises depositing the second metal adhesion layer within the patterned via hole.

21. The method of claim 20, wherein the second metal adhesion layer is deposited using metal organic chemical vapor deposition.

22. The method of claim 12, wherein forming the portion of the first metal adhesion layer comprises heating the wafer to approximately between 100 and 300° C.

23. The method of claim 22, wherein forming the portion of the first metal adhesion layer comprises heating the wafer for approximately between 10 and 50 seconds.

24. The method of claim 12, wherein forming the remainder of the first metal adhesion layer comprises heating the wafer to approximately between 100 and 300° C.

25. The method of claim 24, wherein forming the remainder of the first metal adhesion layer comprises heating the wafer for approximately between 10 and 50 seconds.

26. The method of claim 12, wherein forming the second metal adhesion layer comprises heating the wafer to approximately between 350 and 450° C.

27. The method of claim 26, wherein forming the second metal adhesion layer comprises heating the wafer for approximately between 50 and 200 seconds.

28. The method of claim 12, wherein forming the portion of the first metal adhesion layer comprises heating the wafer to approximately 200° C.

29. The method of claim 28, wherein forming the portion of the first metal adhesion layer comprises heating the wafer for approximately 49 seconds.

30. The method of claim 12, wherein forming the remainder of the first metal adhesion layer comprises heating the wafer to approximately 200° C.

31. The method of claim 30, wherein forming the remainder of the first metal adhesion layer comprises heating the wafer for approximately 49 seconds.

32. The method of claim 12, wherein forming the second metal adhesion layer comprises heating the wafer to approximately 450° C.

33. The method of claim 32, wherein forming the second metal adhesion layer comprises heating the wafer for approximately 177 seconds.

* * * * *